(12) United States Patent
Uehling et al.

(10) Patent No.: US 8,704,370 B2
(45) Date of Patent: Apr. 22, 2014

(54) SEMICONDUCTOR PACKAGE STRUCTURE HAVING AN AIR GAP AND METHOD FOR FORMING

(75) Inventors: Trent S. Uehling, New Braunfels, TX (US); Burton J. Carpenter, Austin, TX (US); Brett P. Wilkerson, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/537,388

(22) Filed: Jun. 29, 2012

(65) Prior Publication Data

US 2014/0001632 A1    Jan. 2, 2014

(51) Int. Cl.
*H01L 23/48* (2006.01)

(52) U.S. Cl.
USPC .......................................... 257/738; 438/613

(58) Field of Classification Search
USPC ....................................................... 257/738
See application file for complete search history.

(56) References Cited

U.S. PATENT DOCUMENTS

| 5,474,958 | A | 12/1995 | Djennas et al. |
| 7,651,891 | B1 | 1/2010 | Nguyen |
| 2010/0252923 | A1 * | 10/2010 | Watanabe et al. ............. 257/737 |

OTHER PUBLICATIONS

Joseph, P. et al., "Improved fabrication of micro air-channels by incorporation of a structural barrier", Institute of Physics Publishing Journal of Micromechanics and Microengineering, Oct. 1, 2004, pp. 35-42.
Kash, J. et al., "Optical PCB Overview", IBM Research, Nov. 2009.

\* cited by examiner

*Primary Examiner* — Anthony Ho
(74) *Attorney, Agent, or Firm* — Joanna G. Chiu; James L. Clingan, Jr.

(57) ABSTRACT

A package structure includes a package substrate having a top surface and a bottom surface. A semiconductor die having a top surface and a bottom surface. The semiconductor die is mounted to the package substrate. The bottom surface of the semiconductor die is adjacent to the top surface of the package substrate. An air gap is between the bottom surface of the package substrate and the bottom surface of semiconductor die.

20 Claims, 7 Drawing Sheets

SEMICONDUCTOR PACKAGE STRUCTURE HAVING AN AIR GAP AND METHOD FOR FORMING

BACKGROUND

1. Field

This disclosure relates generally to semiconductor processing, and more specifically, to a semiconductor package structure having an air gap.

2. Related Art

Ball Grid Array (BGA) is a semiconductor packaging technology in which a semiconductor die is mounted on a top surface of a BGA package substrate and a plurality of solder balls is formed in a grid pattern on a bottom surface of the BGA package substrate. The BGA package can then be attached to a printed circuit board (PCB), in which the grid of solder balls of the BGA package forms electrical connections between the die and the PCB. However, the coefficient of thermal expansion (CTE) of the semiconductor die is typically low compared to the BGA package substrate and compared to the PCB. This results in a region of high stress at the solder balls which are located directly below the die, in particular at those solder balls which are located directly below the die edges. The die edges form the highest regions of stress due to the die being mechanically attached to the BGA package substrate by a die attach adhesive and encapsulated in molding. The BGA package substrate is thereby restrained by the die. The high stress region causes the BGA interconnects located within the region to mechanically fail.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, in order to reduce stress resulting from the CTE mismatch between a semiconductor die and a package substrate in a package structure, such as a BGA package structure, an air gap is formed between the semiconductor die and a bottom surface of the package substrate. The semiconductor die is mounted on a top surface of a package substrate, in which a bottom surface of the semiconductor die is adjacent to the top surface of the package substrate. An air gap is located between the bottom surface of the package substrate and the bottom surface of the semiconductor die. This air gap may be located between the bottom surface of the semiconductor die and the top surface of the package substrate or may be located within the package substrate, between the top and bottom surfaces of the package substrate. This air gap, which is located directly below the semiconductor die or below an edge of the semiconductor die, decouples the semiconductor die from the bottom surface of the package substrate thereby reducing stress in the interconnects between the package substrate and PCB.

Figure 1:
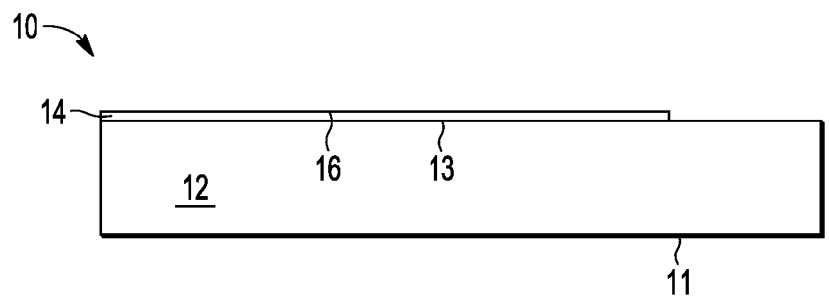
FIG. 1 illustrates a cross sectional view of a package structure at a stage in processing in accordance with one embodiment of the present disclosure.
Figure 2:
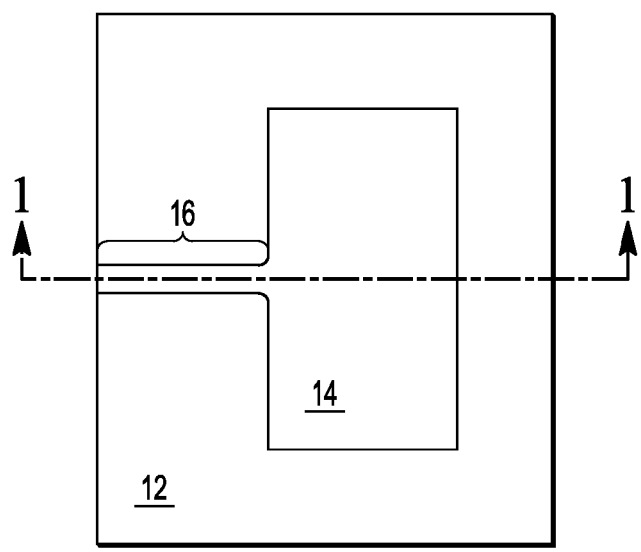
FIG. 2 illustrates a top down view of the package structure of FIG. 1.

FIG. 1 illustrates a cross sectional view of a package structure 10 at a stage in processing. Package structure 10 includes a package substrate 12 having a top surface 13 and a bottom surface 11. In the illustrated embodiment, package structure 10 is a BGA package structure and package substrate 12 is a BGA package substrate. Package structure 10 includes a die attach 14 on top surface 13 of package substrate 12. In one embodiment, die attach 14 is a thermally decomposable material (TDM), such as a copolymer. This copolymer may be, for example, polypropylene carbonate, polycyclohexene carbonate, polynorbornene carbonate, polynorbornene, or poly (alkylene carbonate). FIG. 2 illustrates a top down view of package substrate 12 with die attach 14. Die attach 14 includes a vent portion 16 which extends to an edge of package substrate 12. Die attach 14 corresponds to the location of an air gap which will be formed upon decomposition of die attach 14, and vent portion 16 corresponds to the location of a vent which will be formed upon decomposition of die attach 14. Therefore, die attach 14 may be described as defining an air gap region which includes an extension portion defined by vent portion 16. (Note that die attach 14 may also be referred to as TDM die attach 14 or TDM 14.)

Figure 3:
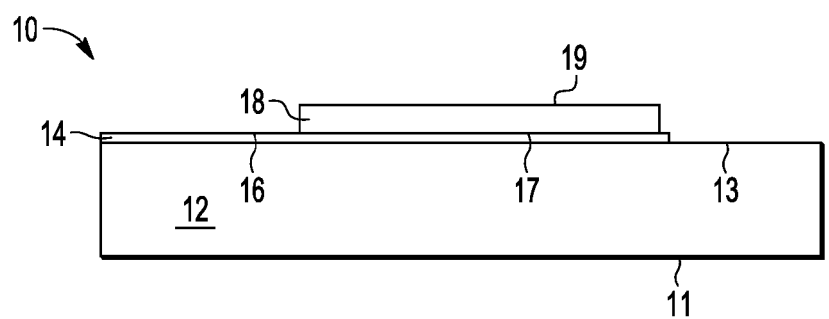
FIG. 3 illustrates a cross sectional view of the package structure of FIG. 1 at a subsequent stage in processing.

FIG. 3 illustrates a cross sectional view of package structure 10 at a subsequent stage in processing in which a semiconductor die 18 is mounted onto die attach 14. Note that semiconductor die 18 is mounted onto the major portion of die attach 14 in which vent portion 16 extends laterally from die 18 to the edge of package substrate 12. Die 18 includes a top surface 19 and a bottom surface 17, in which bottom surface 17 is placed directly on die attach 14 and is adjacent to top surface 13 of package substrate 12. Note that die 18 can be any type of semiconductor die or any component that may be mounted to a package substrate, such as passive components (e.g. resistors, capacitors).

Figure 4:
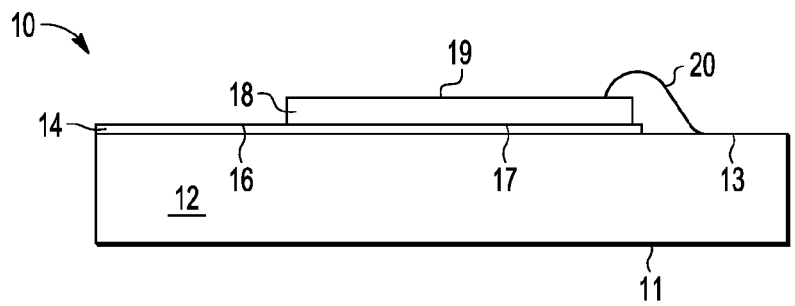
FIG. 4 illustrates a cross sectional view of the package structure of FIG. 3 at a subsequent stage in processing.
Figure 5:
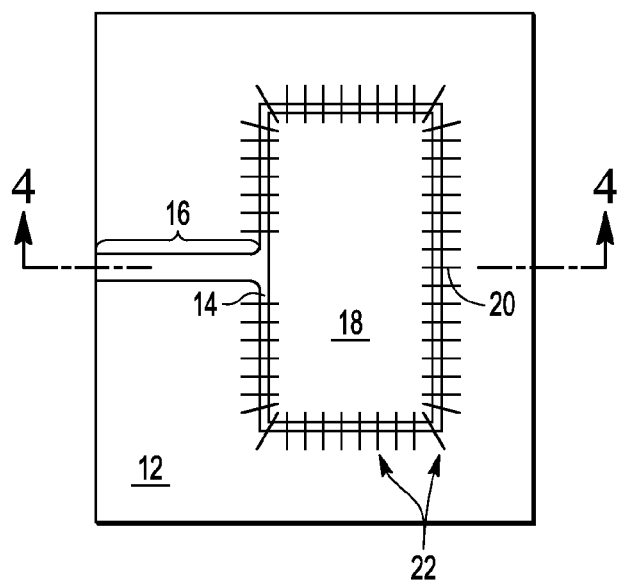
FIG. 5 illustrates a top down view of the package structure of FIG. 4.

FIG. 4 illustrates a cross sectional view of package structure 10 at a subsequent stage in processing in which wirebonds, including exemplary wirebond 20, are formed from top surface 19 of die 18 to top surface 13 of package substrate 12. FIG. 5 illustrates a top down view of package structure 10 in FIG. 4. In the illustrated embodiment, wirebonds 22, including exemplary wirebond 20, are formed in a radial fashion around an edge of die 18. However, wirebonds are not formed over vent portion 16. Also, the immediately adjacent wirebond on either side of vent portion 16 may be placed at a predetermined distance from vent portion 16. Wirebonds 22 provide electrical connections between die 18 and package substrate 12.

Figure 6:
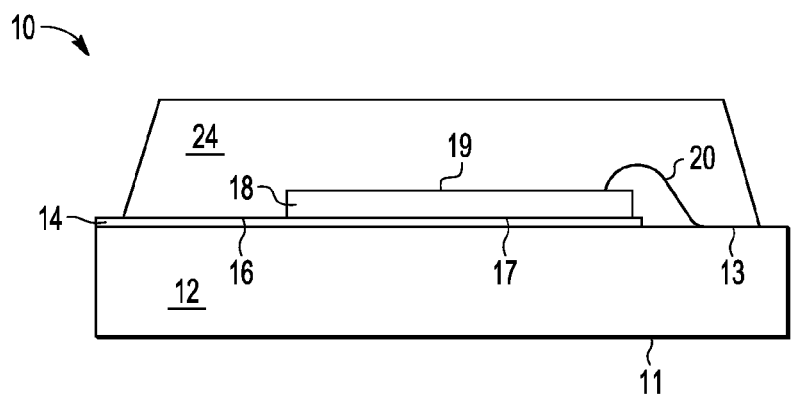
FIG. 6 illustrates a cross sectional view of the package structure of FIG. 4 at a subsequent stage in processing.

FIG. 6 illustrates a cross sectional view of package structure 10 at a subsequent stage in processing in which an encapsulant 24 is formed over die 18 and package substrate 12. Encapsulant 24 completely surrounds the peripheral edges of die 18 and completely covers die 18 and wirebonds 22. Also, encapsulant 24 directly contacts top surface 19 of die 18, portions of die attach 14, and top surface 13 of package substrate 12. In the illustrated embodiment, encapsulant 24 is in direct contact with all of top surface 19. Note that vent portion 16, which extends to the edge of package substrate 12, extends beyond encapsulant 24 such that at least an end portion of vent portion 16 remains exposed and not covered by encapsulant 24.

Figure 7:
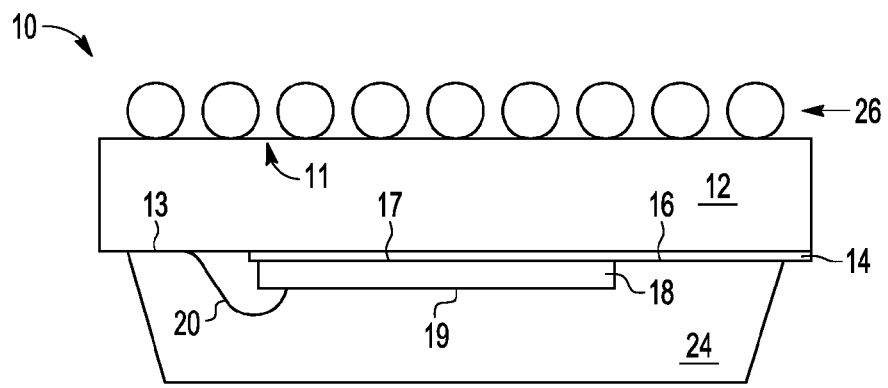
FIG. 7 illustrates a cross sectional view of the package structure of FIG. 6 at a subsequent stage in processing.

FIG. 7 illustrates a cross sectional view of package structure 10 at a subsequent stage in processing in which package structure 10 has been flipped over (i.e. rotated 180 degrees). Solder balls 26 are placed in a pattern on the bottom side 11 of package substrate 12. In one embodiment, the pattern is a grid pattern, but other patterns may be used. In one embodiment, a flux material is first placed in a grid pattern on bottom side 11 of package substrate 12, and solder balls 26 are placed on the flux material. Note that solder balls 26 may be formed of any appropriate alloys and may be formed having a different shape.

Figure 8:
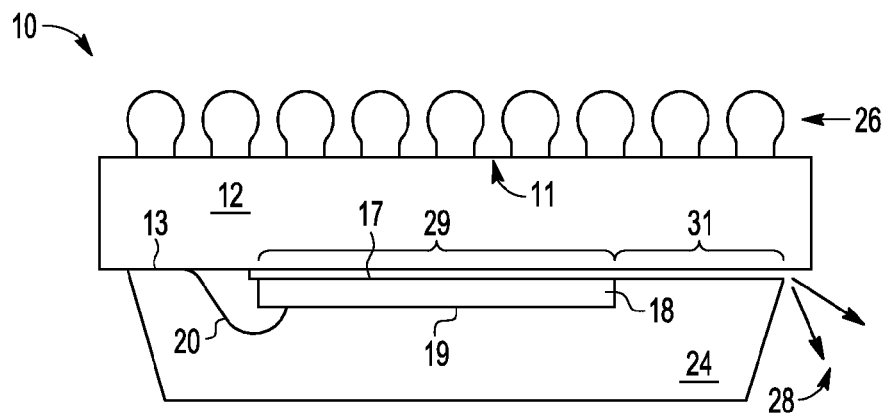
FIG. 8 illustrates a cross sectional view of the package structure of FIG. 7 at a subsequent stage in processing.

FIG. 8 illustrates a cross sectional view of package structure 10 at a subsequent stage in processing in which package structure 10 is reflowed. During reflow, solder balls 26 melt and then solidify, thus attaching to bottom surface 11 of package substrate 12 (e.g. by way of the flux material). In one embodiment, the reflow is performed at a temperature of 200 degrees Celsius or more, such as, for example, 250 degrees Celsius. In one embodiment, the reflow is performed at a temperature and duration sufficient to cause decomposition of TDM die attach 14. For example, many TDMs decompose at a temperature of 180 degrees Celsius or more. Therefore, during reflow, decomposed die attach 28 is released as gas by way of a vent 31 (which no longer includes vent portion 16 of die attach 14 due to the decomposition). This results in an air gap 29 formed directly under die 18, between bottom surface 17 of die 18 and top surface 13 of package substrate 12. Therefore, air gap 29 and vent 31 are formed within the air gap region which was defined by die attach 14. Note that the width of die attach 14 at the edge of package substrate 12 corresponds to the width of vent 31, and different widths may be used.

Note that in an alternate embodiment, the decomposition of TDM die attach 14 may be performed separately from the reflow. For example, prior to attaching solder balls 26, package structure 10 may be exposed to a sufficiently high temperature and duration to cause decomposition of TDM die attach 14. For example, structure 10 may be exposed to a temperature of 180 degrees Celsius or more, or, to a temperature of greater than 200 degrees Celsius. Note that, regardless of whether the decomposition is performed during reflow or prior to reflow, package structure 10 has to be exposed to the higher temperature for a sufficient amount of time to result in the decomposition of substantially all of TDM die attach 14. Also, after decomposition of TDM die attach 14 which results in air gap 29, encapsulant 24 holds die 18 in place relative to package substrate 12.

Figure 9:
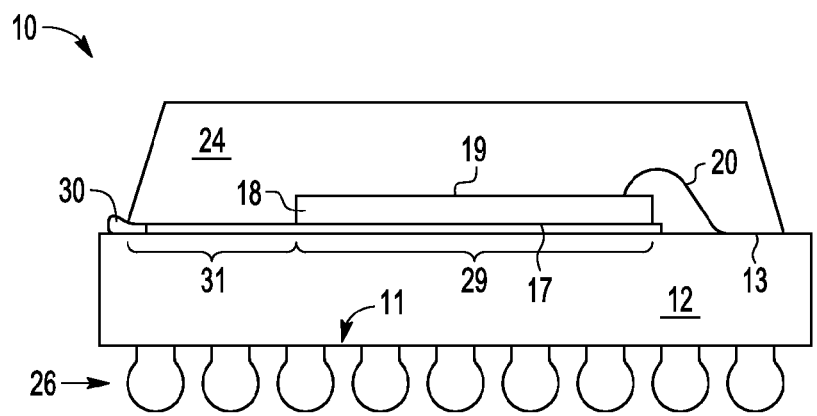
FIG. 9 illustrates a cross sectional view of the package structure of FIG. 8 at a subsequent stage in processing.

FIG. 9 illustrates a cross sectional view of package structure 10 at a subsequent stage in processing in which a plug 30 is used to plug vent 31. For example, plug 30 may be an epoxy-based or silicone-based material which may be partially inserted into vent 31. Plug 30 therefore protects air gap 29.

Figure 10:
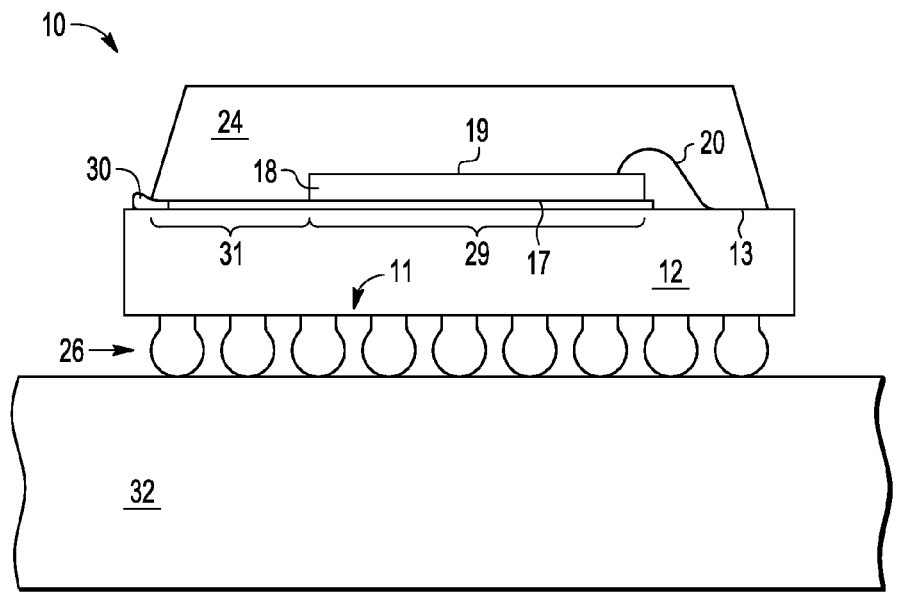
FIG. 10 illustrates a cross sectional view of the package structure of FIG. 9 after attachment to a printed circuit board (PCB).

FIG. 10 illustrates a cross sectional view of package structure 10 at a subsequent stage in processing in which solder balls 26 are attached to a PCB 32. That is, package substrate 12 is mounted to PCB 32 such that bottom surface 11 of package substrate 12 is adjacent a top surface of PCB 32. Therefore, electrical connections from die 18 by way of wirebonds 22 are routed through package substrate 12 to solder balls 26, and solder balls 26 provide the electrical connections to PCB 32. In one embodiment, package substrate 12 and PCB 32 include the same or similar materials and thus may have the same or similar CTE.

Air gap 29 decouples die 18 from bottom surface 11 of package substrate 12, thus reducing the areas of high stress which are formed in prior art BGA package structures. In the illustrated embodiment, air gap 29 is under substantially all of die 18 and extends outside a perimeter of die 18. However, in an alternate embodiment, air gap 29 may be present only under the edges of die 18, since the edges may be the most problematic regions in terms of causing stress on solder balls 26. Therefore, the effects of the mismatch in CTE between die 18 and substrate 12 and between die 18 and PCB 32 may be reduced by air gap 29.

Figure 11:
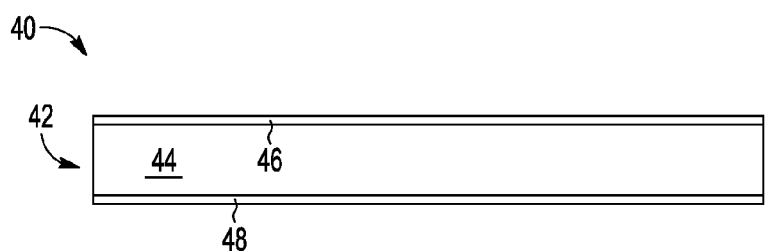
FIG. 11 illustrates a cross sectional view of a package structure at a stage in processing in accordance with another embodiment of the present disclosure.

FIG. 11 illustrates a cross sectional view of a package structure 40 at a stage in processing. Package structure 40 includes a core 42 having a laminate layer 44 and copper cladding 46 on a top surface of laminate layer 44 and copper cladding 48 on a bottom surface of laminate 44. Core 42 may also be referred to as a copper clad laminate core.

Figure 12:
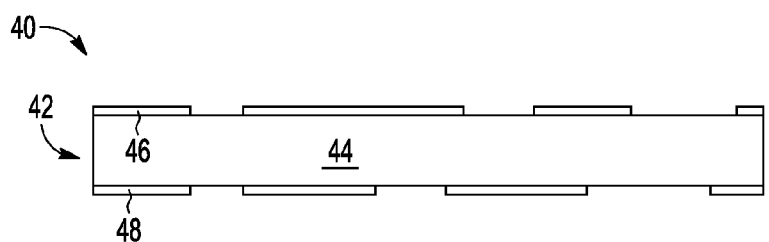
FIG. 12 illustrates a cross sectional view of the package structure of FIG. 11 at a subsequent stage in processing.

FIG. 12 illustrates a cross sectional view of package structure 40 at a subsequent stage in processing in which copper cladding 46 and 48 are each patterned. The patterning is performed as will be needed to route signals through the package substrate from the semiconductor die to the solder balls and PCB.

Figure 13:
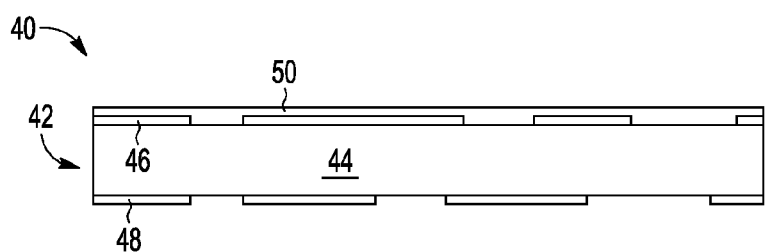
FIG. 13 illustrates a cross sectional view of the package structure of FIG. 12 at a subsequent stage in processing.

FIG. 13 illustrates a cross sectional view of package structure 40 at a subsequent stage in processing in which a layer of TDM 50 is formed over copper cladding 46 and the top surface of laminate 44.

Figure 14:
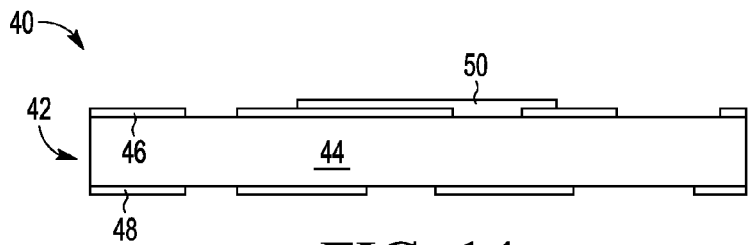
FIG. 14 illustrates a cross sectional view of the package structure of FIG. 13 at a subsequent stage in processing.

FIG. 14 illustrates a cross sectional view of package structure 40 at a subsequent stage in processing in which the layer of TDM 50 is patterned to define an air gap region which will be located under the semiconductor die.

Figure 15:
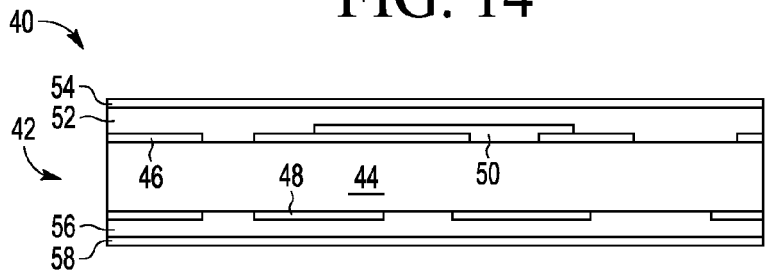
FIG. 15 illustrates a cross sectional view of the package structure of FIG. 14 at a subsequent stage in processing.

FIG. 15 illustrates a cross sectional view of package structure 40 at a subsequent stage in processing in which a resin layer 52 and conductive layer 54 are stacked on the top surface of laminate 44 such that resin layer 52 is between conductive layer 54 and copper cladding 46 and between conductive layer 54 and TDM 50, and a resin layer 56 and conductive layer 58 are stacked on the bottom surface of laminate 44 such that resin layer 56 is between copper cladding 48 and conductive layer 58. In one embodiment, this stacking is performed by stacking a conductive layer (e.g. a copper layer) on a prepreg layer onto the top surface of laminate 44 and stacking a conductive layer (e.g. a copper layer) and a prepreg layer onto the bottom surface of laminate 44. All the layers are pressed together (in which each prepreg layer is between laminate 44 and a conductive layer) and exposed to heat and pressure in order to cure the resin. The prepreg layers are a fibrous material that has been preimpregnated with a particular synthetic resin (such as, for example, a glass cloth preimpregnated with partially cured or b-staged epoxy resin). During the curing, the resin flows and adheres to core 42.

Figure 16:
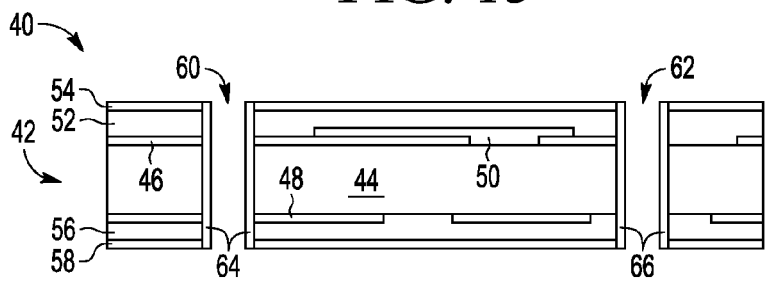
FIG. 16 illustrates a cross sectional view of the package structure of FIG. 15 at a subsequent stage in processing.

FIG. 16 illustrates a cross sectional view of package structure 40 at a subsequent stage in processing in which via openings 60 and 62 are formed through package structure 40. Via openings 60 and 62 are then plated to form conductive vias 64 and 66 through package structure 40.

Figure 17:
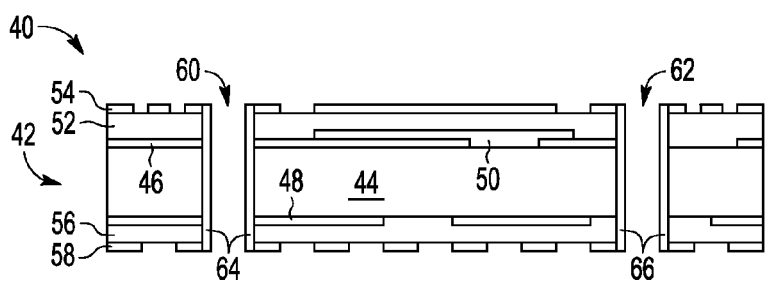
FIG. 17 illustrates a cross sectional view of the package structure of FIG. 16 at a subsequent stage in processing.

FIG. 17 illustrates a cross sectional view of package structure 40 at a subsequent stage in processing in which conductive layers 54 and 58 are each patterned, as needed, to route electrical connections and identify locations for subsequent electrical connections.

Figure 18:
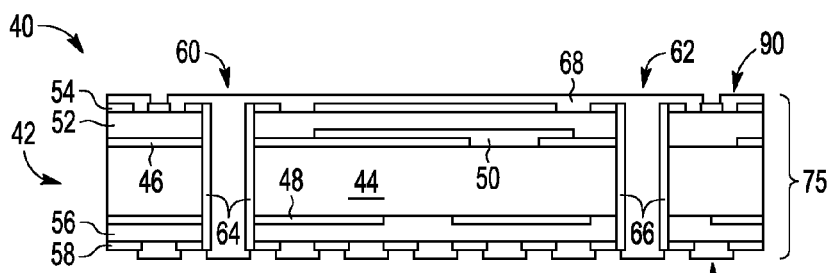
FIG. 18 illustrates a cross sectional view of the package structure of FIG. 17 at a subsequent stage in processing.

FIG. 18 illustrates a cross sectional view of package structure 40 at a subsequent stage in processing in which a solder mask layer 68 is formed over conductive layers 54 and 58 and within openings 60 and 62. In an alternate embodiment (not shown), openings 60 and 62 may be prefilled with epoxy resin prior to forming the solder mask layers. Solder mask layer 68 is patterned to expose portions of conductive layer 54 and 58. For example, patterned solder mask layer 68 may expose regions of conductive layer 54 to which wirebonds will be formed and patterned solder mask layer 68 may expose regions of conductive layer 58 to which solder balls will be subsequently attached. Therefore, illustrated in FIG. 18 is a substantially completed package substrate 75 having a top surface 90 and a bottom surface 92. Note that further processing, such as nickel/gold plating may be formed on the exposed portions of conductive layers 54 and 58.

Figure 19:
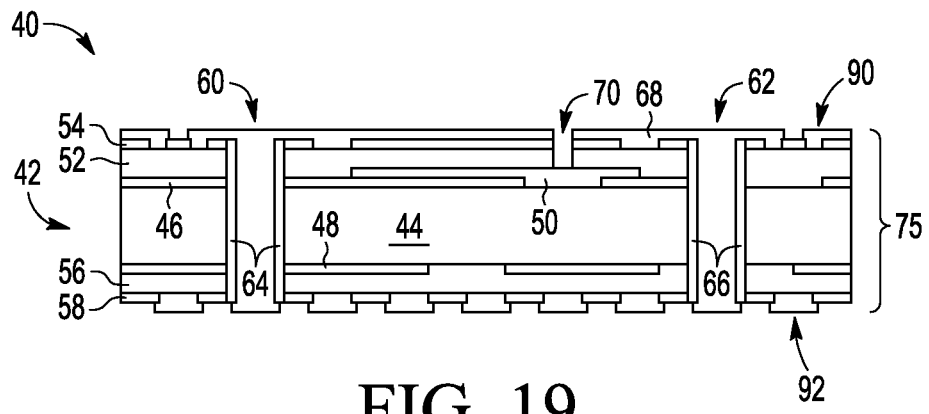
FIG. 19 illustrates a cross sectional view of the package structure of FIG. 18 at a subsequent stage in processing.

FIG. 19 illustrates a cross sectional view of package structure 40 at a subsequent stage in processing in which a vent is formed in package substrate 75 from top surface 90 extending to TDM 50 so as to expose TDM 50.

Figure 20:
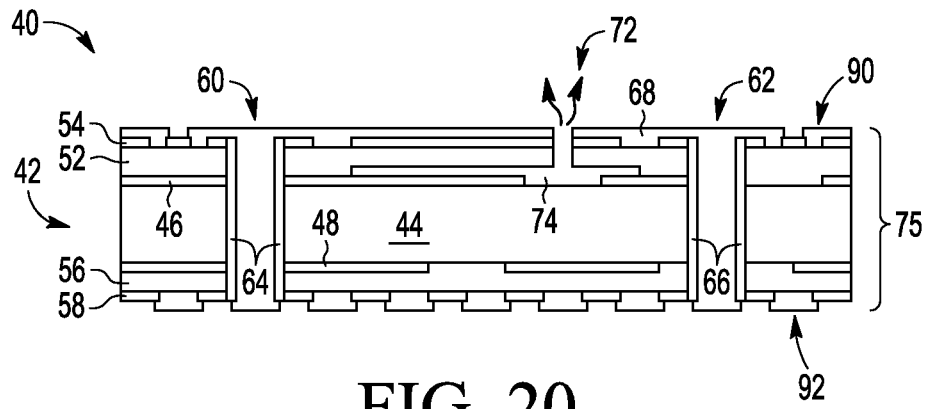
FIG. 20 illustrates a cross sectional view of the package structure of FIG. 19 at a subsequent stage in processing.

FIG. 20 illustrates a cross sectional view of package structure 40 at a subsequent stage in processing in which a temperature and duration sufficient to cause decomposition of TDM 50 is applied to package substrate 75. For example, many TDMs decompose at a temperature of 180 degrees Celsius or more. Therefore, a temperature of at least 180 degrees Celsius, or a temperature of at least 200 degrees Celsius is applied, during which decomposed TDM 72 is released as gas by way of the vent 70. This results in an air gap 74 formed within the air gap region which was defined by TDM 50 formed within package substrate 75. Note that package substrate 75 is exposed to the higher temperature for a sufficient amount of time to result in the decomposition of substantially all of TDM 50.

Figure 21:
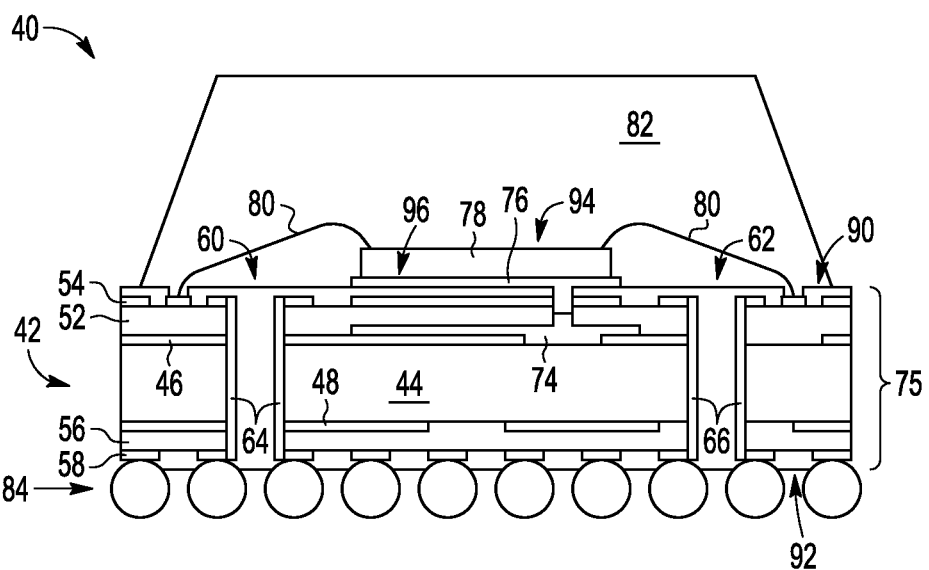
FIG. 21 illustrates a cross sectional view of the package structure of FIG. 20 at a subsequent stage in processing.

FIG. 21 illustrates a cross sectional view of package structure 40 at a subsequent stage in processing in which a semiconductor die 78 is mounted or attached to top surface 90 of package substrate 75 by way of a die attach 76. Die attach 76 is first formed over package substrate 75 and may extend into vent 70. Die 78 is then mounted onto die attach 76. Die 78 has a top surface 94 and a bottom surface 96. Wirebonds 80 are formed from top surface 94 of die 78 to top surface 90 of package substrate 75 (to exposed portions of conductive layer 54). An encapsulant 82 is formed over die 78 and package substrate 75. In the illustrated embodiment, encapsulant 82 completely surrounds the peripheral edges of die 78 and completely covers die 78 and wirebonds 80. Also, encapsulant 82 directly contacts top surface 94 of die 78, and may be in direct contact with all of top surface 94. Solder balls 84 are formed on bottom surface 92. Note that solder balls 84 may be formed in manner similar to what was described in reference to solder balls 26. For example, solder balls 84 may be attached to bottom surface 92 of package substrate 75 in a grid pattern by way of a flux material and then reflowed. Therefore, electrical connections from die 78 by way of wirebonds 80 are routed through package substrate 75 to solder balls 84.

In an alternate embodiment, vent 70 may be plugged after decomposition of TDM 50 and prior to formation of die attach 76. In yet another alternate embodiment, vent 70 is not formed. In this embodiment, the decomposed TDM may diffuse through the resin and solder mask.

Figure 22:
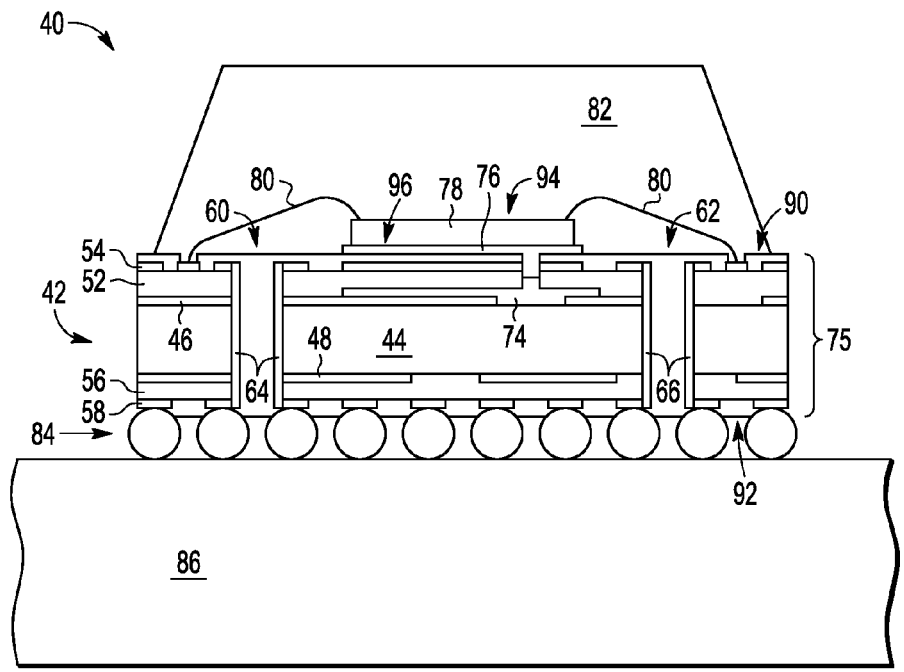
FIG. 22 illustrates a cross sectional view of the package structure of FIG. 21 after attachment to a PCB.

FIG. 22 illustrates a cross sectional view of package structure 40 at a subsequent stage in processing in which solder balls 84 are attached to a PCB 86. That is, package substrate 75 is mounted to PCB 86 such that bottom surface 92 of package substrate 75 is adjacent a top surface of PCB 86. Therefore, solder balls 84 provide the electrical connections to PCB 86. In one embodiment, package substrate 75 and PCB 86 are formed of the same or similar materials and thus have may have the same or similar CTE.

Figures 23, 24:
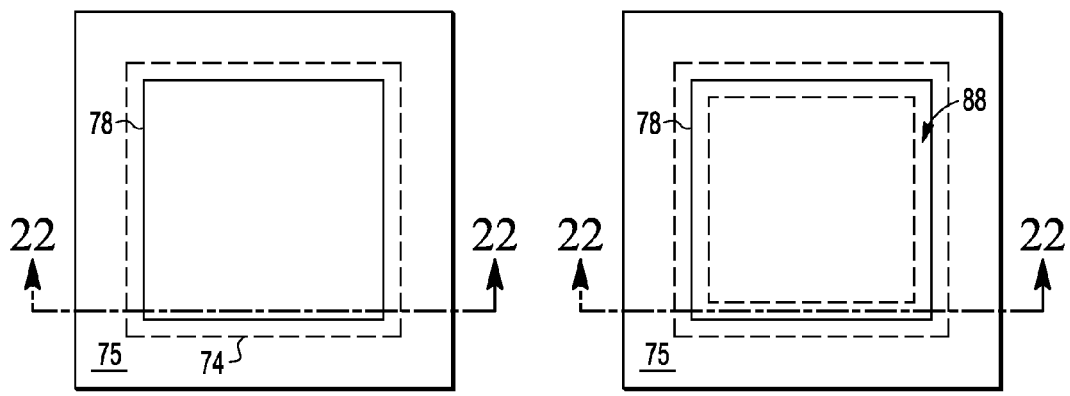
FIG. 23 illustrates a top down view of the package structure of FIG. 22.
FIG. 24 illustrates a top down view of the package structure of FIG. 23 in accordance with an alternate embodiment.

Air gap 74 decouples die 78 from bottom surface 92 of package substrate 75, thus reducing the areas of high stress which are formed in prior art BGA package structures. In the illustrated embodiment, air gap 74 is under substantially all of die 78 and extends outside a perimeter of die 78, as illustrated by the top down view of FIG. 23 (in which the dotted line represents the outline of air gap 74). However, in an alternate embodiment, air gap 74 may be present only under the edges of die 78, since the edges may be the most problematic regions in terms of causing stress on solder balls 84. This embodiment is illustrated by the top down view of FIG. 24 in which the areas between the dotted lines represent an air gap 88 that is under the edges of die 78. Air gap region 88 may be formed in the manner described above in reference to FIGS. 11-22 in which TDM 50 is patterned accordingly to a define an air gap region accordingly. Therefore, by way of air gap 74 or 88, the effects of the mismatch in CTE between die 78 and substrate 75 and between die 78 and PCB 86 may be reduced.

By now it should be understood how the formation of an air gap in a BGA package structure between a bottom surface of the semiconductor die and a bottom surface of the package substrate may result in reduced stress by decoupling the die from the bottom surface of the package substrate. This may therefore result in increased reliability of the electrical connections between the BGA package structure and a PCB.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the air gap can be formed within the die attach or within the package substrate of the package structure. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a package substrate including a package substrate having a top surface and a bottom surface; and a semiconductor die having a top surface and a bottom surface; wherein: the semiconductor die is mounted to the package substrate; the bottom surface of the semiconductor die is adjacent to the top surface of the package substrate; and an air gap is between the bottom surface of the package substrate and the bottom surface of semiconductor die. Item 2 includes the package structure of item 1, and further includes a printed circuit board having a top surface, wherein the package substrate is mounted to the printed circuit board and the bottom surface of the package substrate is adjacent to the top surface of the printed circuit board. Item 3 includes the package structure of item 2, wherein the package substrate and the printed circuit board are of the same material. Item 4 includes the package structure of item 3, wherein the top surface of the semiconductor die is wirebonded to the top surface of the package substrate. Item 5 includes the package structure of item 4, wherein the package substrate is mounted to the printed circuit board by solder balls. Item 6 includes the package structure of item 1, wherein the air gap is between the top surface of the package substrate and the bottom surface of the semiconductor die. Item 7 includes the package structure of item 1, and further including encapsulant on the top surface of the semiconductor die and a portion of the top surface of the package substrate. Item 8 includes the package structure of item 7, wherein the semiconductor die is held in place relative to the package substrate by the encapsulant. Item 9 includes the package structure of item 8, wherein the air gap has a vent that provides an opening to outside of the encapsulant, the package structure further comprising a plug in the vent. Item 10 includes the package structure of item 1, wherein the air gap is in the package substrate. Item 11 includes the package structure of item 10, wherein the air gap extends outside a perimeter of the semiconductor die. Item 12 includes the package structure of item 10, wherein the air gap has a vent that extends to the top surface of the package substrate. Item 13 includes the package structure of item 12, and further includes die attach between the top surface of the package substrate and the bottom surface of the semiconductor die that attaches semiconductor die to the package substrate and is in the vent.

Item 14 includes a method of forming a package structure, the method including attaching a semiconductor die having a top surface and a bottom surface to a package substrate having a top surface and a bottom surface, wherein the bottom surface of the semiconductor die is adjacent to the top surface of the package substrate; creating an air gap region between the bottom surface of the package substrate and the bottom surface of the semiconductor die with a decomposable material; and removing the decomposable material to leave an air gap in the air gap region. Item 15 includes the method of item 14, and further includes applying an encapsulant over the top surface of the semiconductor die and over a portion of a top surface of the package substrate, wherein the attaching includes using the decomposable material between the bottom surface of the semiconductor die and the top surface of the package substrate to attach the semiconductor die to the package substrate prior to the step of applying. Item 16 includes the method of item 15, wherein the air gap region includes an extension from under the semiconductor die to outside the encapsulant to form a vent. Item 17 includes the method of item 16, wherein the step of removing includes removing the decomposable material through the vent, the method further including plugging the vent after the step of removing. Item 18 includes the method of item 14, wherein the air gap region is in the package substrate, and further includes: forming a vent from the air gap region to outside the package substrate, wherein: the step of removing the decomposable material includes removing the decomposable material through the vent. Item 19 includes the method of item 18, wherein the step of attaching is further characterized by: being performed after the step of removing the decomposable material; and plugging the vent with die attach used in attaching the semiconductor die to the package substrate.

Item 20 includes a package structure, including: a package substrate having a top surface and a bottom surface; solder balls attached to the bottom surface of the package substrate; a semiconductor die having a top surface and a bottom surface; an encapsulant on the top surface of the semiconductor die and on a portion of the package substrate; and an air gap between the bottom surface of the semiconductor die and the bottom surface of the package substrate, wherein the semiconductor die is attached to the package substrate with the top surface of the package substrate adjacent to the bottom surface of the semiconductor die.

What is claimed is:

1. A package structure, comprising:
   a package substrate having a top surface and a bottom surface; and
   a semiconductor die having a top surface and a bottom surface;
   wherein:
   the semiconductor die is mounted to the package substrate;
   the bottom surface of the semiconductor die is adjacent to the top surface of the package substrate; and
   an air gap is between the bottom surface of the package substrate and the bottom surface of semiconductor die; and
   encapsulant in direct contact with the to surface of the semiconductor die and a portion of the to surface of the package substrate and in direct contact with peripheral surfaces of the semiconductor die.

2. The package structure of claim 1, further comprising a printed circuit board having a top surface, wherein the package substrate is mounted to the printed circuit board and the bottom surface of the package substrate is adjacent to the top surface of the printed circuit board.

3. The package structure of claim 2, wherein the package substrate and the printed circuit board are of the same material.

4. The package structure of claim 3, wherein the top surface of the semiconductor die is wirebonded to the top surface of the package substrate.

5. The package structure of claim 4, wherein the package substrate is mounted to the printed circuit board by solder balls.

6. The package structure of claim 1, wherein the air gap is between the top surface of the package substrate and the bottom surface of the semiconductor die.

7. The package structure of claim 6, wherein the air gap has a vent that extends along the top surface of the package substrate, between the top surface of the package substrate and the encapsulant, to provide an opening outside of the encapsulant.

8. The package structure of claim 6, wherein the semiconductor die is held in place relative to the package substrate by the encapsulant.

9. The package structure of claim 8, wherein the air gap has a vent that provides an opening to outside of the encapsulant, the package structure further comprising a plug in the vent.

10. The package structure of claim 1, wherein the encapsulant is in direct contact with peripheral surfaces of the semiconductor die.

11. A package structure, comprising:
a package substrate having a to surface and a bottom surface; and
a semiconductor die having a to surface and a bottom surface;
wherein:
the semiconductor die is mounted to the package substrate;
the bottom surface of the semiconductor die is adjacent to the top surface of the package substrate;
an air gap is between the bottom surface of the package substrate and the bottom surface of semiconductor die
the package substrate includes a plurality of layers, and wherein the air gap is in the package substrate, between two layers of the plurality of layers.

12. The package structure of claim 11, wherein the air gap extends outside a perimeter of the semiconductor die.

13. The package structure of claim 11, wherein the air gap has a vent that extends to the top surface of the package substrate.

14. The package structure of claim 13, further comprising die attach between the top surface of the package substrate and the bottom surface of the semiconductor die that attaches semiconductor die to the package substrate and is in the vent.

15. A method of forming a package structure, comprising:
attaching a semiconductor die having a top surface and a bottom surface to a package substrate having a top surface and a bottom surface, wherein the bottom surface of the semiconductor die is adjacent to the top surface of the package substrate;
applying an encapsulant over the to surface of the semiconductor die and over a portion of a to surface of the package substrate, wherein the encapsulant is in direct contact with the to surface and peripheral surfaces of the semiconductor die, wherein the attaching comprises using a decomposable material between the bottom surface of the semiconductor die and the to surface of the package substrate to attach the semiconductor die to the package substrate prior to the step of applying;
creating an air gap region between the bottom surface of the package substrate and the bottom surface of the semiconductor die with a decomposable material; and
removing the decomposable material to leave an air gap in the air gap region.

16. The method of claim 15, further comprising applying an encapsulant over the top surface of the semiconductor die and over a portion of a top surface of the package substrate, wherein the attaching comprises using the decomposable material between the bottom surface of the semiconductor die and the top surface of the package substrate to attach the semiconductor die to the package substrate prior to the step of applying.

17. The method of claim 16, wherein the air gap region includes an extension from under the semiconductor die to outside the encapsulant to form a vent.

18. The method of claim 17, wherein the step of removing comprises removing the decomposable material through the vent, the method further comprising plugging the vent after the step of removing.

19. A method of forming a package structure, comprising:
attaching a semiconductor die having a top surface and a bottom surface to a package substrate having a top surface and a bottom surface, wherein the bottom surface of the semiconductor die is adjacent to the top surface of the package substrate;
creating an air gap region in the package substrate with a decomposable material;
forming a vent from the air gap region to outside the package substrate; and
removing the decomposable material through the vent to leave an air gap in the air gap region,
wherein the step of attaching is further characterize by being performed after the step of removing the decomposable material.

20. The method of claim 19, wherein the step of attaching is further characterized by:
plugging the vent with die attach material, wherein the die attach material is used to attach the semiconductor die to the package substrate.

* * * * *